(12) United States Patent
Chan

(10) Patent No.: US 6,593,245 B1
(45) Date of Patent: Jul. 15, 2003

(54) SILICON NITRIDE ETCH PROCESS WITH CRITICAL DIMENSION GAIN

(75) Inventor: Maria Chan, San Jose, CA (US)

(73) Assignee: Advanced Micro Devices, Sunnyvale, CA (US)

(*) Notice: Subject to any disclaimer, the term of this patent is extended or adjusted under 35 U.S.C. 154(b) by 0 days.

(21) Appl. No.: 08/690,848

(22) Filed: Aug. 1, 1996

Related U.S. Application Data

(63) Continuation of application No. 08/342,174, filed on Nov. 18, 1994, now abandoned.

(51) Int. Cl.⁷ .................................................. B44C 1/22
(52) U.S. Cl. .......................................... 438/724; 438/744
(58) Field of Search ............................ 438/724, 744

(56) References Cited

U.S. PATENT DOCUMENTS

| | | | |
|---|---|---|---|
| 4,028,155 A | | 6/1977 | Jacob ......................... 156/643 |
| 4,377,438 A | | 3/1983 | Moriya et al. ............... 156/643 |
| 4,484,979 A | * | 11/1984 | Stocker ........................ 156/643 |
| 4,529,476 A | | 7/1985 | Kawamoto et al. .......... 156/643 |
| 4,654,114 A | * | 3/1987 | Kadomura .................... 156/643 |
| 4,836,885 A | * | 6/1989 | Breiten et al. ............... 156/643 |
| 4,897,365 A | * | 1/1990 | Baldi et al. ................... 437/69 |
| 4,966,870 A | * | 10/1990 | Barber et al. ................ 437/228 |
| 5,217,567 A | | 6/1993 | Cote et al. ................... 156/643 |
| 5,314,575 A | | 5/1994 | Yanagida ..................... 156/651 |

FOREIGN PATENT DOCUMENTS

| JP | 4309221 | 10/1992 |
|---|---|---|
| WO | WO84/04996 | 12/1984 |

OTHER PUBLICATIONS

Riley, et al, "Reactor Characterization for a Process to Etch $Si_3N_4$ Formed on Thin $SiO_2$," IEEE Transactions on Semiconductor Manufacturing, vol. 6, No. 3 Aug. 1993, pp290–292.

Wong, et al., "Fabrication of sub–20 nm trenches in silicon nitride using $CHF_3/O_2$ reactive ion etching and oblique metallization" Journal of Vacuum Science & Technology, vol. 10, No. 6. Dec. 1992, pp2393–2397.

Dulak, et al., "Etch mechanism in the relative ion etching of silicon nitride" Journal of Vacuum Science and Technology, vol. 9 No. 3 May/Jun. 1991, pp775–778.

* cited by examiner

Primary Examiner—Charles Bowers
Assistant Examiner—Matthew Whipple
(74) Attorney, Agent, or Firm—David H. Jaffer

(57) ABSTRACT

A method for plasma etching of silicon nitride using a mixture of trifluoromethane and oxygen in a ratio of approximately 8 to 1 to selectively etch silicon nitride in preference to silicon dioxide and photoresist, resulting in critical dimension gain.

4 Claims, 4 Drawing Sheets

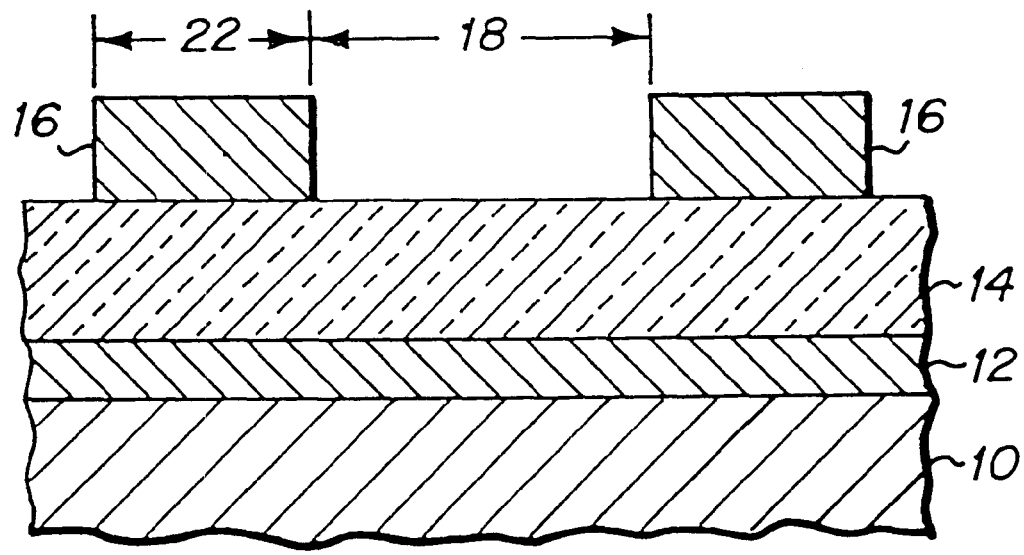
Fig_1
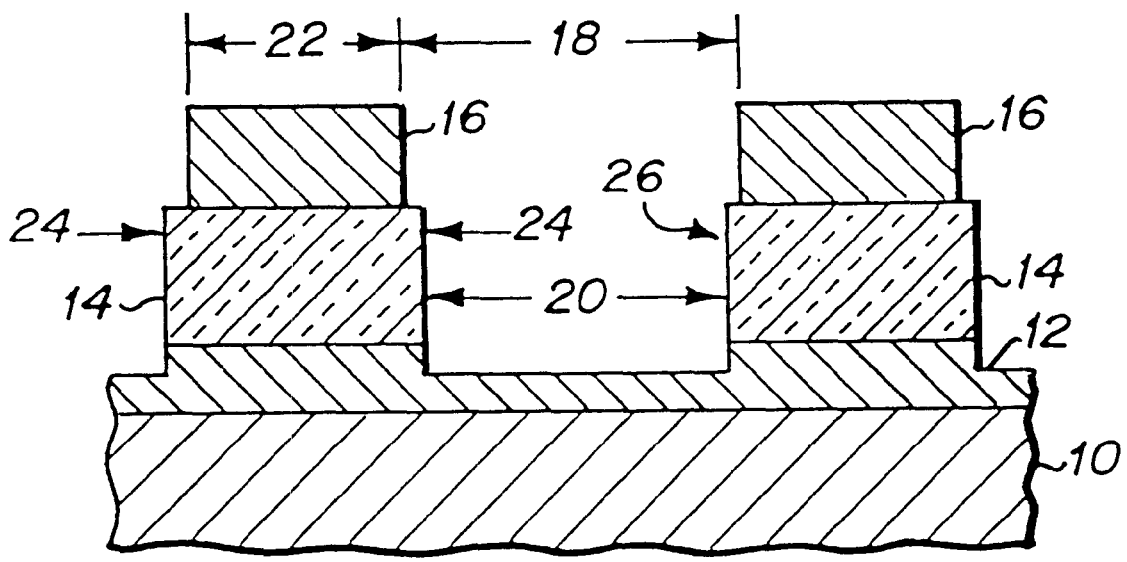
Fig_2

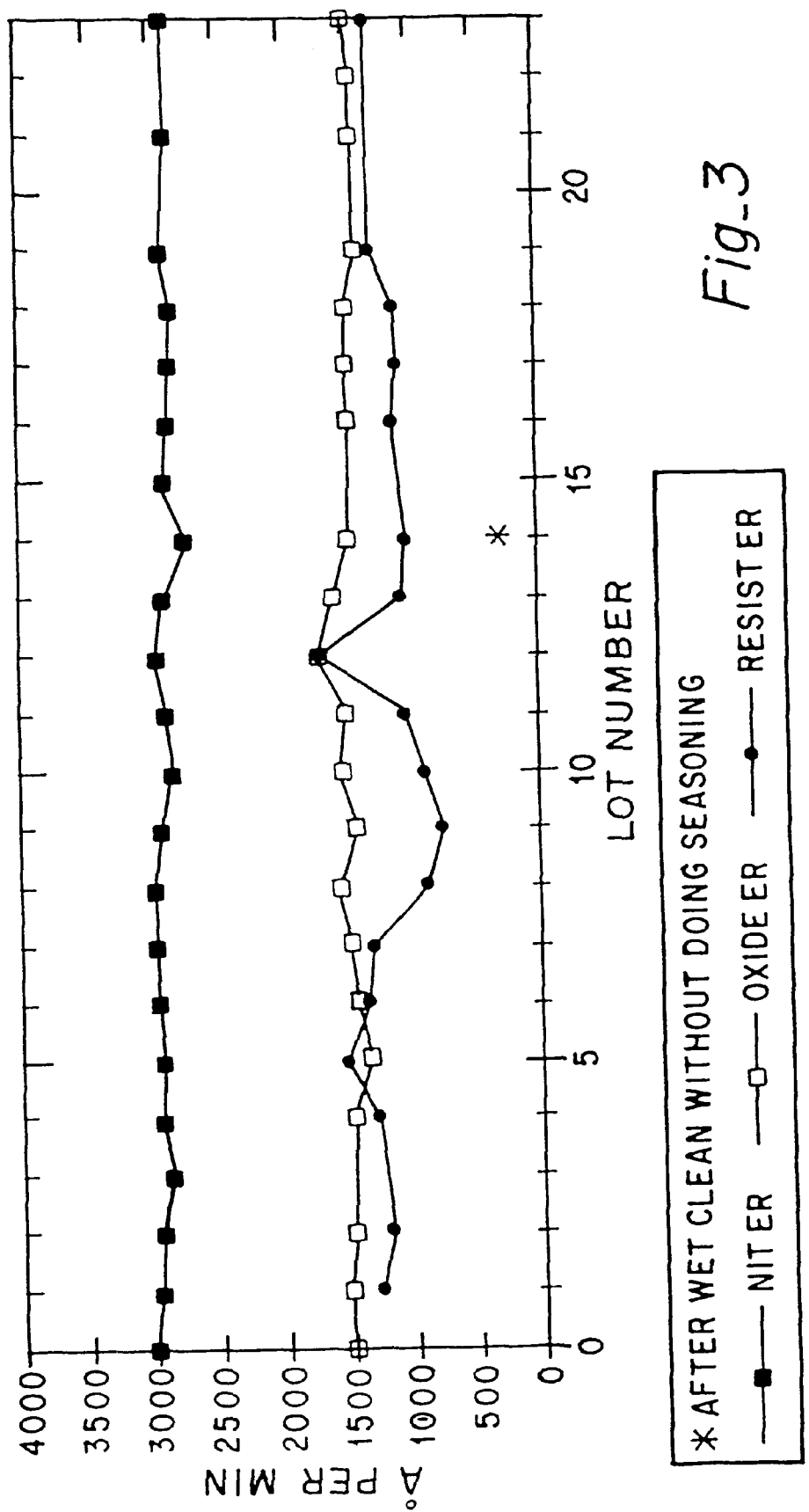
Fig_3

SILICON NITRIDE ETCH PROCESS WITH CRITICAL DIMENSION GAIN

This application is a continuation of Ser. No. 08/342,174 filed on Nov. 18, 1994.

BACKGROUND OF THE INVENTION

1. Field of the Invention

This invention relates generally to a method for etching silicon nitride on a semiconductor wafer, and more particularly to a method for etching silicon nitride which permits critical dimension gain by preferential plasma etching of silicon nitride over silicon dioxide and photoresist with a mixture of $CHF_3$ and $O_2$.

2. Brief Description of the Prior Art

Semiconductor processing often involves patterning a relatively thick layer of silicon nitride coating a relatively thin layer of silicon dioxide supported upon a silicon wafer substrate. The nitride layer is covered with a photoresistant material, and this masking layer is patterned with apertures in accordance with the desired silicon nitride pattern. Such a process is described in U.S. Pat. No. 4,484,979 (Stocker), which discloses a two-step method for patterning silicon nitride in a multifaceted etching chamber without penetrating through the underlying silicon dioxide layer. In the first step, relatively fast etching is accomplished through reactive ion etching (RIE) using trifluoromethane ($CHF_3$) and oxygen ($O_2$) in ratios of 1:1 to 5.7:1. In a second etching step, silicon nitride is more selectively etched with respect to silicon dioxide and photoresist, using a mixture of oxygen to $CHF_3$ which is at least 9:1. Stocker accomplishes high selectivity of nitride to oxide etching in this second etch step, and thereby minimizes widening of apertures in the nitride layer (i.e. minimizes loss of linewidth control).

Barber et al., U.S. Pat. No. 4,966,870, describe selective reactive ion etching of silicon nitride over borophosphosilicate glass and titanium disilicide using a $CHF_3/O_2$ mixture. Baldi et al., U.S. Pat. No. 4,897,365, teach a method for reducing bird beaks (oxide wedges) formed during a planox process using selective etching of silicon nitride over silicon oxide with reactive ion etching using a $CHF_3/CO_2$ mixture. Silicon nitride patterning with photoresist and reactive ion etching of silicon nitride is well known to those skilled in the art, and the disclosures of Stocker, Barber et al. and Baldi et al. describe the such processes in substantial detail.

SUMMARY OF THE INVENTION

It is the primary object of the present invention to provide an improved method for removal of silicon nitride from a semiconductor substrate.

Another object to the present invention is to provide an improved method for removal of silicon nitride in preference to photoresist and silicon oxide in the processing of a semiconductor substrate.

A further object to the present invention is to provide a silicon nitride etch process which results in critical dimension gain.

Briefly, the preferred embodiment of the present invention is a method for plasma etching of silicon nitride using a mixture of trifluoromethane and oxygen in a ratio of approximately 8 to 1 to selectively etch silicon nitride in preference to silicon dioxide and photoresist.

IN THE DRAWING

FIG. 1 illustrates a semiconductor substrate patterned with photoresist prior to etching of silicon nitride;

FIG. 2 illustrates a semiconductor substrate after etching in accordance with the process of the present invention;

FIG. 3 shows the etch rates for silicon nitride, silicon dioxide, and photoresist using the process of the present invention;

DETAILED DESCRIPTION OF THE PREFERRED EMBODIMENT

Figure 4:
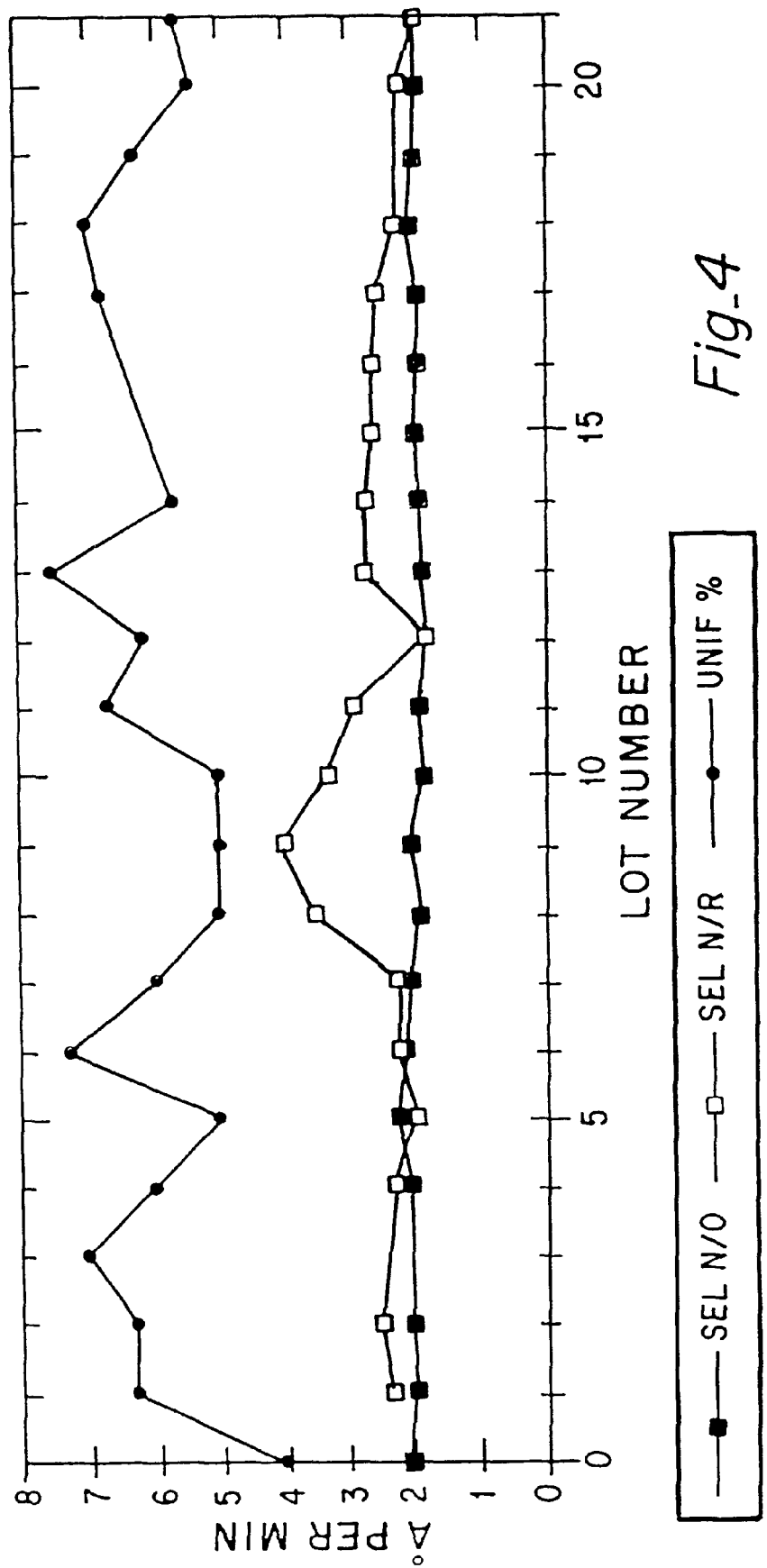
FIG. 4 is a graph showing etch uniformity and selectivity using the process of the present invention.

This invention provides a method for removal of silicon nitride through plasma etching with a mixture of $CHF_3$ and $O_2$. The method selectively removes silicon nitride in preference to photoresist and silicon dioxide and provides critical dimension gain.

With reference to FIG. 1, a silicon semiconductor substrate patterned with photoresist is shown. Silicon substrate 10 supports a layer of silicon dioxide 12 which is approximately 150 to 250 Angstroms thick. A silicon nitride layer 14 of approximately 1800 to 2000 Angstroms is situated on top of the silicon dioxide layer 12. On top of the silicon nitride layer 14 is a layer of photoresist 16 having a thickness of 0.7 to 1.2 micrometers (700 nanometers to 1200 nanometers). The layers are not drawn to scale in order to show the features of the invention more clearly. The measurements discussed below involve KTI I-line positive photoresist, but the critical dimension gain is found with other resists as well.

The photoresist layer 16 has been patterned to leave apertures that are not covered by photoresist and other areas covered by photoresist. A typical aperture as indicated by 18 is on the order of 0.8 to 1.0 micrometers. The width of the photoresist line indicated by 22 is typically on the order of 0.5 micrometers. As noted above, it is particularly desirable to minimize widening of apertures in the nitride layer 18 and thereby minimize loss of control of the linewidth 22. The width 22 is known as the developed inspection critical dimension (DICD), indicating that it is the width of the line 22 after photo mask development (i.e. after photoresist patterning). In the preferred embodiment of the present invention, after photoresist patterning the silicon nitride layer 14 and photoresist layer 16 are subjected to plasma etching in a single-step nitride etch process using a $CHF_3$ flow of 80 sccm (standard cubic centimeters per minute) and an $O_2$ flow of 10 sccm. The gas pressure is approximately 40 millitorr and the discharge is 700 watts with a magnetic field of 20 Gauss. The etching is preferably conducted in a single wafer plasma etcher, where uniformity of etch conditions is easier to achieve than in a multifaceted etching chamber for etching multiple wafers.

Referring now to FIG. 2, the structure on the silicon substrate 10 is shown after plasma etching in accordance with the method of the present invention. Silicon nitride has been removed in the areas where it is not masked by photoresist 16. There has been some etching through the nitride, leaving some silicon dioxide (50 to 170 Angstroms). FIG. 2 illustrates that the width of the photoresist 22 is slightly less than the width of the remaining silicon nitride 14. In particular, the method of the present invention will result in a critical dimension of the silicon nitride 24 which is wider than the critical dimension 22 of the photoresist. In a photoresist line of approximately 0.50 micrometers (500 nanometers), the width of the underlying silicon nitride will be approximately 0.55 micrometers (550 nanometers), a critical dimension gain of 50 nanometers. Although the precise mechanism is not known, the chemistry and operating regime cause the critical dimension gain.

When the photoresist 16 is removed in the next process step, the present invention results in final inspection critical dimension (FICD) gain ranges from 30 to 80 nanometers over the developed inspection critical dimension (DICD). This is in contrast to prior art etch processes which usually experience at least some critical dimension loss. When there is a critical dimension loss from the drawn line on a photoresist mask to the finished product, a greater area of the silicon wafer is necessary to create a particular device. Therefore, the critical dimension gain achieved with the present invention permits higher resolution and smaller device size. After the photoresist removal step is completed, a field oxide layer may be grown over areas of exposed oxide.

We have found that plasma etching using a mixture of $CHF_3$ to $O_2$ in the ratio of at least 6:1 up to 15:1 will provide a satisfactory result with regard to silicon nitride removal and critical dimension gain. Ratios in the range of 6:1 to 10:1 are preferred. The pressure is preferably less than 100 mTorr, and most preferably in the range of 20 to 60 mTorr. The RF power density range is preferably 0.6 to 1.1 W/cm². The optimal process conditions are shown in Table 1:

TABLE 1

| | |
|---|---|
| $CHF_3$ (SCCM) | 80 |
| $O_2$ (SCCM) | 10 |
| Power (Watt) | 700 |
| Pressure (mTorr) | 40 |
| Magnetic Field (Gauss) | 20 |
| Endpoint/Time (sec) | 27* |

*depends on the actual endpoint, this is only an average number for 1350 Å nitride thickness.

The results of the use of this process are a nitride etch rate of approximately 2950 Angstroms per minute, good uniformity of nitride, an oxide etch rate of approximately 1500 Angstroms per minute (selectivity of nitride to oxide is 2:1). The resist etch rate is approximately 1230 Angstroms per minute when measured on oxide. Therefore, the actual etch rate for resist on nitride is much lower (on the order of 500 Angstroms/minute), and the total resist loss is not a concern during the relatively short etching time (approximately 30 seconds). The final inspection critical dimension gain is on the order of 0.06 to 0.16 micrometers from the developed inspection critical dimension. The variation from dense area to large isolated area on the substrate is minimal, with an etch profile of 89° to 90° in the dense area and 82° to 86° in the large isolated area (the angle is that of nitride profile 26 (after photoresist stripping) to the horizontal).

Notably, the present invention is a one step process that considerably simplifies the nitride etch over two step processes. A one step process provides much easier handling. Since the time for the etch is relatively short (around 30 seconds), even though the etch rate is lower in a one step process than in the fast etch step of a two step process, there is not much sacrifice in throughput because there is no need to change reactants/conditions with a one step process.

FIG. 3 illustrates the results obtained with the single etch process in a number of different tests. The graph shows silicon nitride, silicon oxide and resist etch rates. FIG. 4 shows etch uniformity and selectivity of nitride/oxide and nitride/photoresist. The nitride etch uniformity is shown in percent and refers to variations across the processed wafer substrate.

Figure 5:
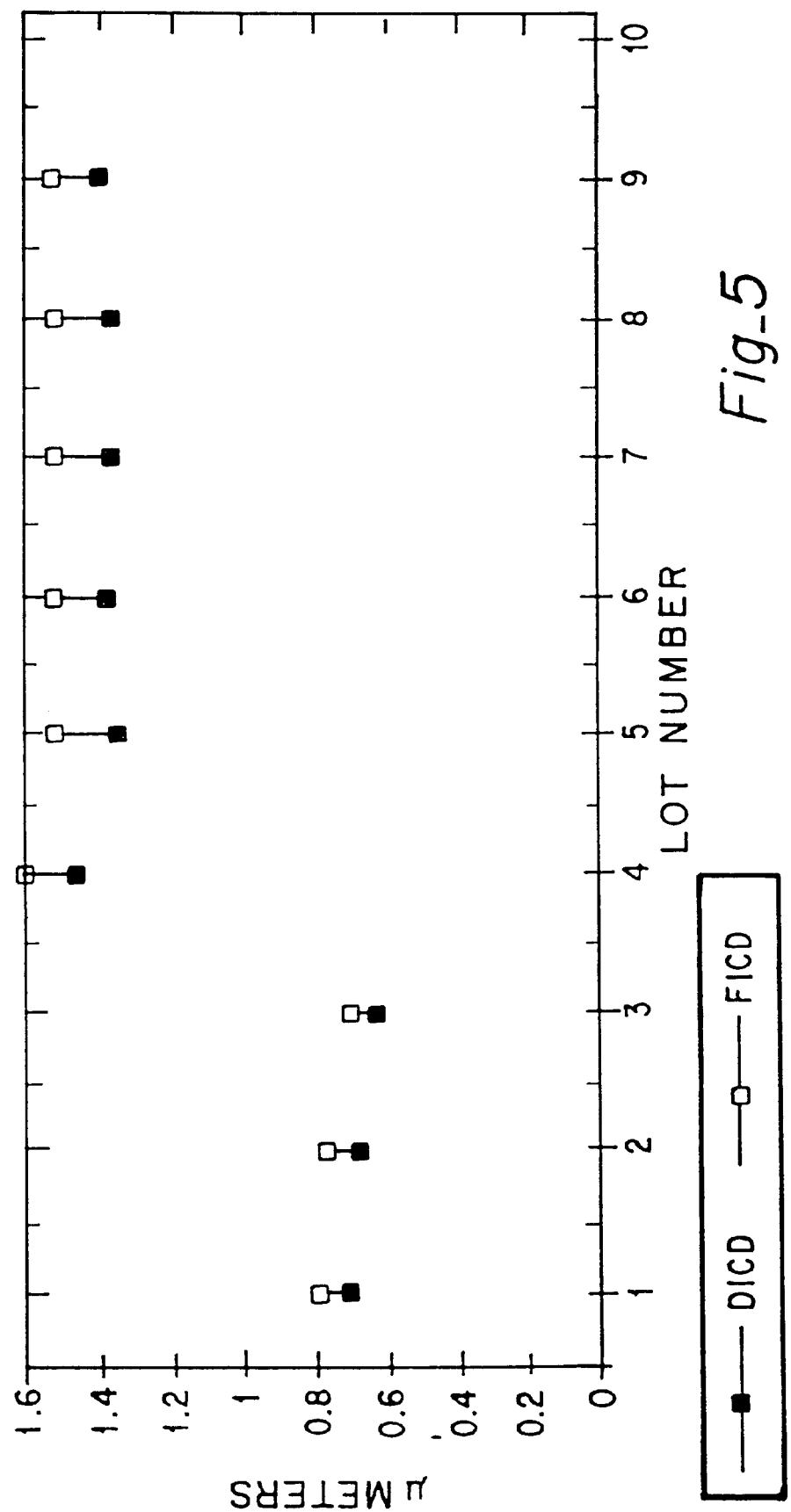
FIG. 5 shows the critical dimension gain obtained with the process of the present invention.

FIG. 5 shows the critical dimension gain with the process of the present invention with 0.7 to 0.8 micron linewidths and 1.4 to 1.6 micron linewidth. As noted above, the method shows critical dimension gain in the final inspection over the developed inspection critical dimension.

Although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A method for etching a silicon nitride layered on a silicon substrate, comprising the steps of:

(a) growing a layer of oxide on the substrate;

(b) depositing a layer of silicon nitride on the oxide layer;

(c) creating a patterned photoresist layer on the silicon nitride layer, said patterned photoresist layer having a plurality of photoresist lines with a developed inspection critical dimension (DICD);

(d) plasma etching the patterned photoresist and silicon nitride layers in a single wafer plasma etcher with one step process conditions with a gas mixture of trifluoromethane and oxygen in a flow ratio of between 6:1 and 10:1 at a pressure between 20 and 60 millitorr, thereby selectively removing the silicon nitride which is not covered by photoresist; and (e) removing the photoresist to uncover silicon nitride underlying the photoresist, said underlying silicon nitride having a final inspection critical dimension (FICD) which exceeds the DICD of the patterned photoresist, whereby a critical dimension gain from the patterned photoresist to the underlying silicon nitride is achieved.

2. The method of claim 1, further comprising the step of growing a field oxide layer over areas of exposed oxide after the photoresist removal step is completed.

3. The method of claim 1, wherein the power density in the etching step is in the range of 0.6 to 1.1 W/cm².

4. The method of claim 2, further comprising the step of growing a field oxide layer over areas of exposed oxide after the photoresist removal step is completed.

* * * * *